(12) United States Patent
Campiglio et al.

(10) Patent No.: US 11,719,771 B1
(45) Date of Patent: Aug. 8, 2023

(54) MAGNETORESISTIVE SENSOR HAVING SEED LAYER HYSTERESIS SUPPRESSION

(71) Applicant: Allegro MicroSystems, LLC, Manchester, NH (US)

(72) Inventors: Paolo Campiglio, Arcueil (FR); Samridh Jaiswal, London (GB); Yen Ting Liu, Hsinchu (TW); Maxim Klebanov, Palm Coast, FL (US); Sundar Chetlur, Frisco, TX (US)

(73) Assignee: Allegro MicroSystems, LLC, Manchester, NH (US)

( * ) Notice: Subject to any disclaimer, the term of this patent is extended or adjusted under 35 U.S.C. 154(b) by 0 days.

(21) Appl. No.: 17/805,054

(22) Filed: Jun. 2, 2022

(51) Int. Cl.
G01R 33/09 (2006.01)
H10N 50/80 (2023.01)
H10N 50/85 (2023.01)

(52) U.S. Cl.
CPC .......... G01R 33/091 (2013.01); H10N 50/80 (2023.02); H10N 50/85 (2023.02); G01R 33/093 (2013.01); G01R 33/096 (2013.01); G01R 33/098 (2013.01)

(58) Field of Classification Search
CPC .. G01R 33/091; G01R 33/093; G01R 33/096; G01R 33/098
See application file for complete search history.

(56) References Cited

U.S. PATENT DOCUMENTS

| | | |
|---|---|---|
| 5,216,560 A | 6/1993 | Brug et al. |
| 5,282,104 A | 1/1994 | Coutellier et al. |
| 5,561,368 A | 10/1996 | Dovek et al. |
| 5,677,625 A | 10/1997 | Dieny |
| 5,821,517 A | 10/1998 | Fedeli et al. |
| 5,858,125 A | 1/1999 | Hasegawa |
| 5,895,727 A | 4/1999 | Hasegawa |
| 5,923,514 A | 7/1999 | Scott et al. |
| 5,933,306 A | 8/1999 | Santos et al. |
| 6,013,365 A | 1/2000 | Dieny et al. |
| 6,026,355 A | 2/2000 | Rahman et al. |
| 6,055,136 A | 4/2000 | Gill et al. |
| 6,069,476 A | 5/2000 | Vieux-Rochaz et al. |
| 6,094,330 A | 7/2000 | Criniti et al. |
| 6,141,197 A | 10/2000 | Kim et al. |
| 6,166,539 A | 12/2000 | Dahlberg et al. |
| 6,278,592 B1 | 8/2001 | Xue et al. |

(Continued)

FOREIGN PATENT DOCUMENTS

| | | |
|---|---|---|
| CN | 201622299 U | 11/2010 |
| CN | 101900754 A | 12/2010 |

(Continued)

OTHER PUBLICATIONS

U.S. Appl. No. 16/157,313, filed Oct. 11, 2018, Lassalle-Balier et al.

(Continued)

*Primary Examiner* — Alesa Allgood
(74) *Attorney, Agent, or Firm* — Daly Crowley Mofford & Durkee, LLP

(57) ABSTRACT

Methods and apparatus for a magnetoresistive (MR) sensor including a seed layer having a CoFe layer for canceling hysteresis in the MR sensor. The MR stackup can include a free layer and a reference layer. The seed layer having CoFe provides a desired texturing of the stackup to cancel hysteresis effects.

23 Claims, 3 Drawing Sheets

(56) References Cited

U.S. PATENT DOCUMENTS

| | | |
|---|---|---|
| 6,373,247 B1 | 4/2002 | Marx et al. |
| 6,411,476 B1 | 6/2002 | Lin et al. |
| 6,429,640 B1 | 8/2002 | Daughton et al. |
| 6,462,641 B1 | 10/2002 | Dieny et al. |
| 6,490,140 B1 | 12/2002 | Mao et al. |
| 6,501,678 B1 | 12/2002 | Lenssen et al. |
| 6,522,132 B1 | 2/2003 | Vieus-Rochaz et al. |
| 6,532,164 B2 | 3/2003 | Redon et al. |
| 6,603,677 B2 | 8/2003 | Redon et al. |
| 6,770,382 B1 | 8/2004 | Chang et al. |
| 7,064,937 B2 | 6/2006 | Wan et al. |
| 7,095,596 B2 | 8/2006 | Schmollngruber et al. |
| 7,106,046 B2 | 9/2006 | Nagano et al. |
| 7,176,679 B2 | 2/2007 | Baragatti et al. |
| 7,259,545 B2 | 8/2007 | Stauth et al. |
| 7,288,931 B2 | 10/2007 | Granig et al. |
| 7,394,247 B1 | 7/2008 | Guo et al. |
| 7,453,672 B2 | 11/2008 | Dieny et al. |
| 7,463,016 B2 | 12/2008 | Shoji |
| 7,472,004 B2 | 12/2008 | Hara et al. |
| 7,713,755 B1 | 5/2010 | Xiao |
| 7,759,933 B2 | 7/2010 | Coillot et al. |
| 7,799,179 B2 | 8/2010 | Maass et al. |
| 7,813,202 B2 | 10/2010 | Rodmacq et al. |
| 7,838,133 B2 | 11/2010 | Zhang et al. |
| 7,855,555 B2 | 12/2010 | Biziere et al. |
| 7,902,811 B2 | 3/2011 | Shoji |
| 7,944,205 B2 | 5/2011 | Fermon et al. |
| 7,944,736 B2 | 5/2011 | Dieny et al. |
| 8,093,886 B2 | 1/2012 | Okada et al. |
| 8,129,988 B2 | 3/2012 | Fermon et al. |
| 8,269,491 B2 | 9/2012 | Cummings et al. |
| 8,279,666 B2 | 10/2012 | Dieny et al. |
| 8,422,176 B1 | 4/2013 | Leng et al. |
| 8,487,701 B2 | 7/2013 | Boujamaa et al. |
| 8,513,944 B2 | 8/2013 | Rodmacq et al. |
| 8,542,072 B2 | 9/2013 | Dieny et al. |
| 8,624,590 B2 | 1/2014 | Dieny |
| 8,638,529 B1 | 1/2014 | Leng et al. |
| 8,669,122 B2 | 3/2014 | Viala et al. |
| 8,743,507 B1 | 6/2014 | Hassan et al. |
| 8,779,764 B2 | 7/2014 | Meguro et al. |
| 8,836,317 B2 | 9/2014 | Kasajima |
| 8,847,589 B2 | 9/2014 | Walther et al. |
| 9,046,562 B2 | 6/2015 | Cummings et al. |
| 9,093,102 B1 | 7/2015 | Gong et al. |
| 9,465,056 B2 | 10/2016 | Han et al. |
| 9,529,060 B2 | 12/2016 | Fermon et al. |
| 9,741,372 B1 | 8/2017 | Campiglio |
| 9,804,234 B2 | 10/2017 | Dressler et al. |
| 9,812,637 B2 | 11/2017 | Fermon et al. |
| 9,922,673 B2 | 3/2018 | Campiglio et al. |
| 10,026,425 B2 | 7/2018 | Campiglio |
| 10,060,880 B2 | 8/2018 | Chen et al. |
| 10,347,277 B2 | 7/2019 | Campiglio et al. |
| 10,620,279 B2 | 4/2020 | Campiglio et al. |
| 10,734,443 B2 | 8/2020 | Lassalle-Balier et al. |
| 10,753,989 B2 | 8/2020 | Campiglio et al. |
| 10,840,001 B2 | 11/2020 | Lassalle-Balier et al. |
| 11,002,807 B2 | 5/2021 | Campiglio et al. |
| 11,022,661 B2 | 6/2021 | Lassalle-Balier et al. |
| 11,127,518 B2 | 9/2021 | Campiglio et al. |
| 11,193,989 B2 | 12/2021 | Campiglio et al. |
| 11,217,626 B2 | 1/2022 | Campiglio et al. |
| 2002/0061421 A1 | 5/2002 | Dieny |
| 2002/0158626 A1 | 10/2002 | Shay et al. |
| 2002/0171417 A1 | 11/2002 | Schoedlbauer |
| 2002/0191356 A1 | 12/2002 | Hasegawa et al. |
| 2003/0002226 A1 | 1/2003 | Lin et al. |
| 2003/0053266 A1 | 3/2003 | Dieny et al. |
| 2003/0070497 A1 | 4/2003 | Kikuchi et al. |
| 2003/0218840 A1 | 11/2003 | Apel et al. |
| 2003/0226409 A1 | 12/2003 | Steele et al. |
| 2004/0056647 A1 | 3/2004 | Stauth et al. |
| 2004/0056654 A1 | 3/2004 | Goldfine et al. |
| 2004/0086751 A1* | 5/2004 | Hasegawa ............ G01R 33/093 428/815 |
| 2004/0207035 A1 | 10/2004 | Witcraft et al. |
| 2004/0263157 A1 | 12/2004 | Sudo et al. |
| 2005/0068683 A1 | 3/2005 | Gill |
| 2005/0115822 A1 | 6/2005 | Maass et al. |
| 2005/0180059 A1 | 8/2005 | Gill |
| 2006/0002184 A1 | 1/2006 | Hong et al. |
| 2006/0038407 A1 | 2/2006 | Shelley et al. |
| 2006/0077598 A1 | 4/2006 | Taylor et al. |
| 2006/0091993 A1 | 5/2006 | Shoji |
| 2006/0114098 A1 | 6/2006 | Shoji |
| 2006/0193089 A1 | 8/2006 | Li et al. |
| 2006/0214656 A1 | 9/2006 | Sudo et al. |
| 2006/0218775 A1 | 10/2006 | Carey et al. |
| 2007/0019341 A1 | 1/2007 | Mizuno et al. |
| 2007/0044370 A1 | 3/2007 | Shoji |
| 2007/0076332 A1 | 4/2007 | Shoji et al. |
| 2007/0121249 A1 | 5/2007 | Parker |
| 2007/0164734 A1 | 7/2007 | Shimizu et al. |
| 2008/0031035 A1 | 2/2008 | Rodmacq et al. |
| 2008/0098167 A1 | 4/2008 | Rodmacq et al. |
| 2008/0151615 A1 | 6/2008 | Rodmacq et al. |
| 2008/0171223 A1 | 7/2008 | Wang et al. |
| 2008/0258721 A1 | 10/2008 | Guo et al. |
| 2008/0316655 A1 | 12/2008 | Shoji |
| 2009/0015972 A1 | 1/2009 | Dieny et al. |
| 2009/0021249 A1 | 1/2009 | Kumar et al. |
| 2009/0027048 A1 | 1/2009 | Sato et al. |
| 2009/0087589 A1 | 4/2009 | Guo et al. |
| 2009/0115405 A1 | 5/2009 | Guo |
| 2009/0161268 A1 | 6/2009 | Lin |
| 2009/0189601 A1 | 7/2009 | Okada et al. |
| 2009/0192755 A1 | 7/2009 | Sheiretov et al. |
| 2009/0237075 A1 | 9/2009 | Koss |
| 2009/0251829 A1 | 10/2009 | Zhang et al. |
| 2009/0289694 A1 | 11/2009 | Rieger et al. |
| 2009/0290053 A1 | 11/2009 | Hammerschmidt |
| 2010/0007344 A1 | 1/2010 | Guo et al. |
| 2010/0045277 A1 | 2/2010 | Goldfine et al. |
| 2010/0060263 A1 | 3/2010 | Granig et al. |
| 2010/0142101 A1 | 6/2010 | Sato et al. |
| 2010/0277971 A1 | 11/2010 | Slaughter et al. |
| 2011/0025320 A1 | 2/2011 | Ohta et al. |
| 2011/0062537 A1 | 3/2011 | Oh et al. |
| 2011/0068786 A1 | 3/2011 | Miura et al. |
| 2011/0069413 A1 | 3/2011 | Maat et al. |
| 2011/0133728 A1 | 6/2011 | Tokunaga |
| 2011/0260270 A1 | 10/2011 | Zhang et al. |
| 2012/0119735 A1 | 5/2012 | Zimmer et al. |
| 2012/0156522 A1 | 6/2012 | Maat et al. |
| 2012/0257298 A1* | 10/2012 | Sato ............ G11B 5/3909 360/75 |
| 2012/0286382 A1 | 11/2012 | Jan et al. |
| 2013/0140658 A1 | 6/2013 | Yamane et al. |
| 2013/0299345 A1 | 11/2013 | Abarra et al. |
| 2014/0175574 A1 | 6/2014 | Watts et al. |
| 2014/0197504 A1 | 7/2014 | Moriyama et al. |
| 2014/0250244 A1 | 9/2014 | Song et al. |
| 2014/0252518 A1 | 9/2014 | Zhang et al. |
| 2014/0334032 A1 | 11/2014 | Nishioka et al. |
| 2014/0340791 A1 | 11/2014 | Braganca et al. |
| 2015/0022196 A1 | 1/2015 | Hebiguchi et al. |
| 2015/0177286 A1 | 6/2015 | Fuji et al. |
| 2015/0192648 A1 | 7/2015 | Campiglio et al. |
| 2015/0221326 A1 | 8/2015 | Jung et al. |
| 2015/0333254 A1 | 11/2015 | Liu et al. |
| 2015/0340601 A1 | 11/2015 | Huai et al. |
| 2016/0005954 A1 | 1/2016 | Erickson et al. |
| 2016/0218277 A1 | 7/2016 | Yano et al. |
| 2016/0282101 A1 | 9/2016 | Kaji et al. |
| 2016/0359103 A1 | 12/2016 | Fermon et al. |
| 2017/0148977 A1 | 5/2017 | Zhu et al. |
| 2017/0154643 A1 | 6/2017 | Nishioka et al. |
| 2017/0314969 A1 | 11/2017 | Ausserlechner et al. |
| 2019/0067561 A1* | 2/2019 | Avci ............ H10N 52/00 |
| 2019/0178954 A1 | 6/2019 | Lassalle-Balier et al. |
| 2019/0219616 A1 | 7/2019 | Cadugan et al. |
| 2019/0219643 A1 | 7/2019 | Cadugan et al. |

(56) References Cited

U.S. PATENT DOCUMENTS

| | | | |
|---|---|---|---|
| 2020/0033424 A1 | 1/2020 | Campiglio et al. | |
| 2020/0064413 A1 | 2/2020 | Campiglio et al. | |
| 2021/0035633 A1* | 2/2021 | Chiang | H10N 70/245 |
| 2021/0293911 A1 | 9/2021 | Lassalle-Balier et al. | |
| 2021/0383953 A1 | 12/2021 | Campiglio et al. | |
| 2021/0389393 A1 | 12/2021 | Lassalle-Balier et al. | |

FOREIGN PATENT DOCUMENTS

| | | |
|---|---|---|
| DE | 198 10 838 A1 | 9/1999 |
| DE | 198 43 348 A1 | 3/2000 |
| DE | 102 22 467 A1 | 12/2003 |
| DE | 102 57 253 A1 | 2/2004 |
| DE | 10 2005 024 879 A1 | 12/2006 |
| DE | 10 2005 042 307 A1 | 3/2007 |
| DE | 10 2006 019 483 A1 | 10/2007 |
| DE | 10 2008 030 334 A1 | 1/2010 |
| EP | 0 779 632 A1 | 6/1997 |
| EP | 0 863 406 A2 | 9/1998 |
| EP | 1 323 856 A1 | 7/2003 |
| EP | 1 336 985 A1 | 8/2003 |
| EP | 1 510 787 A2 | 3/2005 |
| EP | 1 617 472 A1 | 1/2006 |
| EP | 1 666 894 A1 | 6/2006 |
| EP | 1 672 321 A1 | 6/2006 |
| EP | 1 777 440 A2 | 4/2007 |
| EP | 1 918 678 A2 | 5/2008 |
| EP | 1 947 469 A1 | 7/2008 |
| FR | 2 727 778 A1 | 6/1996 |
| FR | 2 729 790 A1 | 7/1996 |
| FR | 2 752 302 A1 | 2/1998 |
| FR | 2 773 395 A1 | 7/1999 |
| FR | 2 774 774 A1 | 8/1999 |
| FR | 2 814 592 A1 | 3/2002 |
| FR | 2 817 998 A1 | 6/2002 |
| FR | 2 817 999 A1 | 6/2002 |
| FR | 2 830 621 A1 | 4/2003 |
| FR | 2 876 800 A1 | 4/2006 |
| FR | 2 889 348 A1 | 2/2007 |
| FR | 2 932 315 A1 | 12/2009 |
| JP | 2000-055997 A | 2/2000 |
| JP | 2000-055999 A | 2/2000 |
| JP | 2000-056000 A | 2/2000 |
| JP | 2001-230471 A | 8/2001 |
| JP | 2002-082136 A | 3/2002 |
| JP | 2002-267692 A | 9/2002 |
| JP | 2002-328140 A | 11/2002 |
| JP | 2002-542617 A | 12/2002 |
| JP | 2003-315091 A | 11/2003 |
| JP | 2005-018908 A | 1/2005 |
| JP | 2006-179566 A2 | 7/2006 |
| JP | 2006-214910 A | 8/2006 |
| JP | 2007-101253 A | 4/2007 |
| JP | 2007-108069 A | 4/2007 |
| JP | 2009-014544 A | 1/2009 |
| JP | 2009-252342 A | 10/2009 |
| JP | 2018-037613 A | 3/2018 |
| TW | I 513993 B | 12/2015 |
| TW | I 6333321 B | 8/2018 |
| WO | WO 2001/067085 A1 | 9/2001 |
| WO | WO 2002/084680 A1 | 10/2002 |
| WO | WO 2003/032338 A1 | 4/2003 |
| WO | WO 2003/104829 A1 | 12/2003 |
| WO | WO 2003/107018 A1 | 12/2003 |
| WO | WO 2004/048986 A2 | 6/2004 |
| WO | WO 2004/068152 A1 | 8/2004 |
| WO | WO 2004/068158 A1 | 8/2004 |
| WO | WO 2005/028993 A1 | 3/2005 |
| WO | WO 2006/136577 A1 | 12/2006 |
| WO | WO 2007/095971 A1 | 8/2007 |
| WO | WO 2007/148028 A2 | 12/2007 |
| WO | WO 2007/148029 A1 | 12/2007 |
| WO | WO 2008/012309 A2 | 1/2008 |
| WO | WO 2008/015354 A2 | 2/2008 |
| WO | WO 2009/001160 A1 | 12/2008 |
| WO | WO 2009/001162 A2 | 12/2008 |
| WO | WO 2009/007324 A1 | 1/2009 |
| WO | WO 2009/110892 A1 | 9/2009 |
| WO | WO 2010/001077 A2 | 1/2010 |
| WO | WO 2010/026948 A1 | 3/2010 |
| WO | WO 2010/066976 A1 | 6/2010 |
| WO | WO 2010/084165 A1 | 7/2010 |
| WO | WO 2010/113820 A1 | 10/2010 |
| WO | WO 2010/116102 A1 | 10/2010 |
| WO | WO 2011/007767 A1 | 1/2011 |
| WO | WO 2010/136527 A1 | 12/2012 |
| WO | WO 2018/012953 A1 | 1/2018 |

OTHER PUBLICATIONS

U.S. Appl. No. 16/157,317, filed Oct. 11, 208, Lassalle-Balier et al.
U.S. Appl. No. 17/813,412, filed Jul. 19, 2022, Jaiswal et al.
Allegro MicroSystems, LLC, "High Sensitivity, 1 MHz GMR-Based Current Sensor IC in Space-Saving Low Resistance QFN Package;" ACS70331; Dec. 1, 2017; 22 Pages.
Lee et al.; "Critical Thickness Effects of NiFeCr—CoFe Seed Layers for Spin Valve Multilayers;" IEEE Transactions on Magnetics, vol. 40, No. 4; Jul. 20024; pp. 2209-2211; 3 Pages.
Repetski et al.; "Improved Interfaces and Magnetic Properties in Spin Valves Using $Ni_{80}Fe_{20}$ Seed Layer;" Journal of Applied Physics, vol. 91, No. 6; Mar. 15, 2002; pp. 3891-3895; 5 Pages.
Sankaranarayanan et al.; "Exchange Bias Variations of the Seed and Top NiFe Layers in NiFe/FeMn/NiFe Trilayer as a Function of Seed Layer Thickness;" Journal of Magnetism and Magnetic Material 286; Feb. 2005; pp. 196-199; 4 Pages.
Notice of Allowance dated Aug. 22, 2019 for U.S. Appl. No. 15/869,620; 11 Pages.
Taiwan $1^{st}$ Office Action (with English Translation) dated May 28, 2020 for Taiwan Application No. 108127885; 20 Pages.
PCT International Search Report and Written Opinion of the ISA dated Jun. 3, 2015; for PCT Pat. App. No. PCT/US2015/010424; 17 Pages.
Response to PCT Written Opinion dated Feb. 27, 2017 for EP Pat. Appl. No. 15700938.2; 4 Pages.
Amended Claims included with A.A. Thornton response dated Feb. 27, 2017 for EP Pat. Appl. No. 15700938.2; 6 Pages.
U.S. Preliminary Amendment filed on Oct. 19, 2018 for U.S. Appl. No. 16/113,321; 7 Pages.
U.S. Non-Final Office Action dated Feb. 7, 2020 for U.S. Appl. No. 16/113,321; 16 Pages.
Response to U.S. Non-Final Office Action dated Feb. 7, 2020 for U.S. Appl. No. 16/113,321; Response filed Apr. 10, 2020; 12 Pages.
U.S. Notice of Allowance dated May 14, 2020 for U.S. Appl. No. 16/113,321; 15 Pages.
U.S. Preliminary Amendment filed on Nov. 1, 2019 for U.S. Appl. No. 16/507,538; 12 Pages.
U.S. Second Preliminary Amendment filed on Nov. 4, 2019 for U.S. Appl. No. 16/507,538; 12 Pages.
U.S. Notice of Allowance dated May 4, 2020 for U.S. Appl. No. 16/507,538; 10 Pages.
Response (with Machine English Translation) to Taiwan Office Action dated May 28, 2020 for Taiwan Application No. 108127885; Response filed Aug. 18, 2020; 19 Pages.
Taiwan Allowance Decision (with English Translation) dated Oct. 29, 2020 for Taiwan Application No. 108127885; 3 Pages.
Extended European Search Report (EESR) dated Feb. 23, 2021 for European Application No. 20184390.1; 9 Pages.
Taiwan Office Action (with English Translation) dated Dec. 1, 2021 for Taiwan Application No. 110101393; 9 Pages.
Response (with Machine English Translation) to Taiwan Office Action dated Dec. 1, 2021 for Taiwan Application No. 110101393; Response filed Feb. 9, 2022; 38 Pages.
Taiwan Allowance Decision (with English Translation) dated May 2, 2022 for Taiwan Application No. 110101393; 3 Pages.
U.S. Non-Final Office Action dated Jan. 12, 2017 for U.S. Appl. No. 14/591,213; 7 Pages.
Response to U.S. Non-Final Office Action dated Jan. 12, 2017 for U.S. Appl. No. 14/591,213; Response filed Apr. 4, 2017; 16 Pages.

(56) References Cited

OTHER PUBLICATIONS

U.S. Notice of Allowance dated Jul. 19, 2017 for U.S. Appl. No. 14/591,213; 6 Pages.
PCT International Preliminary Report dated Jul. 21, 2016 for International Application No. PCT/US2015/010424; 11 Pages.
European Decision to Grant dated Sep. 17, 2020 for European Application No. 15700938.2; 2 Pages.
Japanese Notice of Reasons for Rejection (with English Translation) dated Nov. 13, 2018 for Japanese Application No. 2016-545864; 13 Pages.
Response (with Machine English Translation) to Japanese Notice of Reasons for Rejection dated Nov. 13, 2018 for Japanese Application No. 2016-545864; Response filed Jan. 28, 2019; 20 Pages.
Japanese Allowance Report (with Claims and English Translation) dated Mar. 26, 2019 for Japanese Application No. 2016-545864; 10 Pages.
Korean $1^{st}$ Office Action (with English Translation) dated Nov. 23, 2020 for Korean Application No. 10-2016-7021480; 25 Pages.
Response (with English Translation) to Korean $1^{st}$ Office Action dated Nov. 23, 2020 for Korean Application No. 10-2016-7021480; Response filed Jan. 21, 2021; 137 Pages.
Korean $2^{nd}$ Office Action (with English Translation) dated May 28, 2021 for Korean Application No. 10-2016-7021480; 34 Pages.
Response (with English Translation) to Korean $2^{nd}$ Office Action dated May 28, 2021 for Korean Application No. 10-2016-7021480; Response filed Jul. 27, 2021; 77 Pages.
Korean Notice of Allowance (with English Translation) dated Nov. 26, 2021 for Korean Application No. 10-2016-7021480; 10 Pages.

\* cited by examiner

MAGNETORESISTIVE SENSOR HAVING SEED LAYER HYSTERESIS SUPPRESSION

BACKGROUND

Magnetic field sensors are used in a variety of applications, including, but not limited to, angle sensing to senses an angle of a direction of a magnetic field, current sensing to sense a magnetic field generated by a current carried by a current-carrying conductor, magnetic switching to sense the proximity of a ferromagnetic object, a detecting rotation to sense passing ferromagnetic articles, for example, magnetic domains of a ring magnet or a ferromagnetic target (e.g., gear teeth) where the magnetic field sensor is used in combination with a back-biased or other magnet, and magnetic field sensing to sense a magnetic field density of a magnetic field.

In certain applications, magnetic field sensors include magnetoresistance elements which have an electrical resistance that changes in the presence of an external magnetic field. Tunnel magnetoresistance (TMR) is a magnetoresistive effect that occurs in a magnetic tunnel junction (MTJ) that includes two ferromagnetic layers separated by an insulator. Electrons tunnel from one ferromagnetic layer into the other due to a quantum mechanic effects. Spin valves are a type of magnetoresistance element formed from two or more magnetic materials or layers. The simplest form of a spin valve has a reference (or magnetically fixed) layer and a free layer between which an insulative barrier is located. The resistance of the spin valve changes as a function of the magnetic alignment of the reference and free layers. Typically, the magnetic alignment of the reference layer does not change, while the magnetic alignment of the free layer moves in response to external magnetic fields.

In some cases, a spin valve may also have a bias. The bias may be generated by one or more magnetic layers (bias layers) that are magnetically coupled to the free layer. In the absence of an external magnetic field, the bias layers may cause the magnetic alignment of the free layer to default to a predetermined alignment. The magnetic coupling between the bias layers and the free layer is relatively weak so that an external field can override the bias and realign the magnetic alignment of the free layer.

Conventional MR sensors may suffer from performances limitations due to undesirable hysteresis effects. While the magnetic coercivity of conventional linear tunneling magnetoresistive (TMR) stacks may be reduced by modifying the free layer design (e.g., materials, composition, thickness, sequence/numbering etc.), a certain amount of hysteresis persists.

SUMMARY

Example embodiments of the disclosure provide methods and apparatus for a MR sensor having a seed layer that reduces hysteresis effects in an MR sensor to increase sensor accuracy. In magnetoresistive sensors, one step to obtain a resistance variation as a function of the magnetic field is to linearize a magnetic response, such as by intra-stack biasing. In Giant Magneto Resistance (GMR) sensors, the response linearization also leads to a substantially complete suppression of coercivity, however, this may not be true for Tunnel Magneto Resistive (TMR) devices. While modifying the free layer design (e.g., materials, composition, thickness, sequence/numbering, etc.) it is possible to reduce the magnetic coercivity of linear TMR stacks. However, a certain amount of hysteresis persists, which may be due to remaining anisotropy in the free layer.

In example embodiments, an MR sensor includes at least one seed layer to cancel magnetic coercivity and remove hysteresis at low fields in TMR stacks linearized with intra-stack bias. In embodiments, a seed layer includes one or more CoFe layers into the seed. The seed layer may also include an Ru layer abutting the CoFe layer. The CoFe in the seed layer results in a change in texturing of the whole multilayer, and in particular, of the free layer which is responsible for the low-field response of the TMR which governs the magnetic coercivity of the TMR stack. It is understood that texturing refers to at least the properties of crystal orientation of materials and/or grain size. It is believed that example embodiments of the seed layer introduce an additional crystalline anisotropy which provides hysteresis suppression. When the applied field is higher than the seed-induced anisotropy, the seed contribution is overcome, and the hysteresis cycle shows the typical opening. Example embodiments be particularly effective when the field used in the application is always lower than the seed-induced anisotropy, so that hysteresis remains negligible.

In one aspect, a magnetoresistive sensor comprises: a free layer; an insulative barrier layer; a reference layer, wherein the free layer and the reference layer are on opposite sides of the barrier layer; and a seed layer comprising a layer of CoFe configured to interface with the reference layer for canceling hysteresis in the magnetoresistive sensor.

A sensor can include one or more of the following features: the seed layer further comprises a layer of Ru abutting the layer of CoFe, the Ru layer interfaces with the reference layer, the seed layer comprises at least two non-adjacent layers of CoFe, the seed layer further comprises a layer of NiFe, the seed layer comprises at least one layer of Cu and at least one layer of Ta, the seed layer comprises alternating layers of Cu and Ta, the layer of CoFe is about 5 nm thick, the layer of CoFe is between about 4 and 6 nm thick, and/or a bias layer adjacent the free layer to provide a double pinning configuration.

In another aspect, a method comprises: forming a free layer and a reference layer on opposite sides of an insulative barrier layer; and interfacing the reference layer with a seed layer comprising a layer of CoFe for canceling hysteresis in a magnetoresistive sensor.

A method can further include one or more of the following features: the seed layer further comprises a layer of Ru abutting the layer of CoFe, the Ru layer interfaces with the reference layer, the seed layer comprises at least two non-adjacent layers of CoFe, the seed layer further comprises a layer of NiFe, the seed layer comprises at least one layer of Cu and at least one layer of Ta, the seed layer comprises alternating layers of Cu and Ta, the layer of CoFe is about 5 nm thick, the layer of CoFe is between about 4 and 6 nm thick, and/or a bias layer adjacent the free layer to provide a double pinning configuration.

In a further aspect, a magnetoresistive sensor comprises: a free layer; an insulative barrier layer; a reference layer, wherein the free layer and the reference layer are on opposite sides of the barrier layer; and a seed layer means for canceling hysteresis in the magnetoresistive sensor, wherein the seed layer means interfaces with the reference layer. In some embodiments, the seed layer means comprises a layer of Ru abutting a layer of CoFe. In some embodiments, the seed layer means comprises at least one layer of Cu and at least one layer of Ta. In some embodiments, the layer of CoFe is about 5 nm thick. In some embodiments, the seed layer means comprises a layer of CoFe between about 4 and about 6 nm in thickness.

BRIEF DESCRIPTION OF THE DRAWINGS

The foregoing features of this invention, as well as the invention itself, may be more fully understood from the following description of the drawings in which.

DETAILED DESCRIPTION

Example embodiments of the disclosure provide methods and apparatus for an MR sensor that includes at least one seed layer to cancel magnetic coercivity and remove hysteresis at low fields in TMR stacks. In embodiments, a seed layer includes one or more CoFe layers that produce a change in texturing of the multilayer stack, and in particular, of a free layer which is responsible for the low-field response of the TMR which governs the magnetic coercivity of the TMR stack. The seed layer may also include an Ru layer abutting the CoFe layer that combine to provide layer texturing that reduces hysteresis effects.

Figure 1:
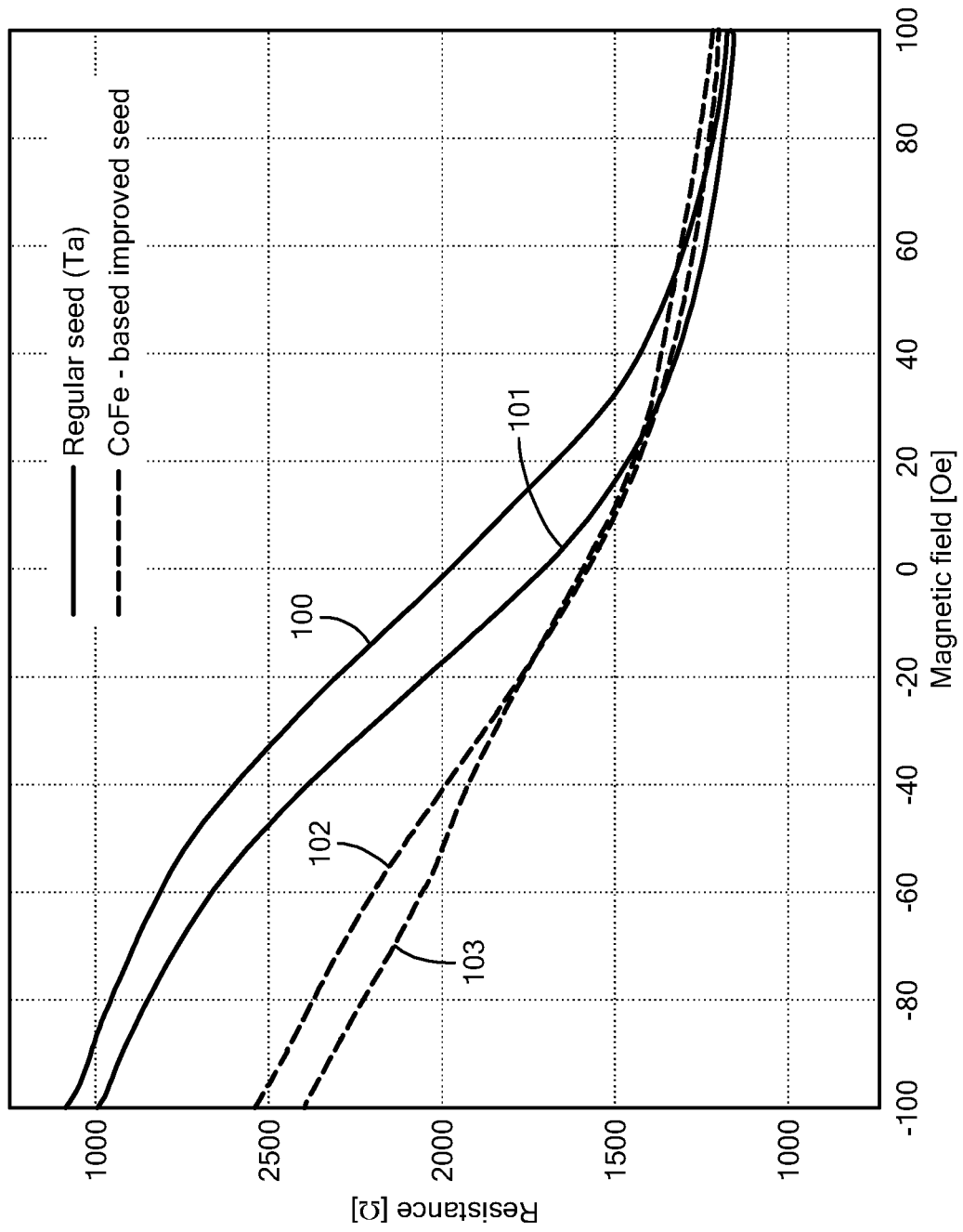
FIG. 1 is a graphical representation of resistance versus magnetic field strength response for a conventional MR sensor and an example sensor in accordance with example embodiments of the disclosure.

FIG. 1 shows an example graphical representation of resistance versus magnetic field for a prior art magnetoresistive (MR) sensor and for an example embodiment of an MR sensor having hysteresis suppression in accordance with example embodiments of the disclosure. The prior art sensor has MR elements that change in resistance over magnetic field change in an inconsistent manner due to hysteresis effects. As can be seen, the conventional MR and seed layer sensor has a response 100, 101 that can randomly follow different branches. In other words, there is an opening between response branches for the same field. The example responses 100, 101 of the prior art sensor are shown to have separation in the presence of the same field.

Example embodiments of an MR sensor suppresses hysteresis effects in the MR elements of the sensor. As can be seen, a response 102, 103 for an example MR sensor more closely tracks with less separation than the prior art sensor response 100, 101. Since the response 100, 101 is more consistent in the presence of the same external magnetic field, the sensor is more accurate. In addition, the example MR sensor increases the linearity of the resistance/magnetic field relationship.

Figure 2:
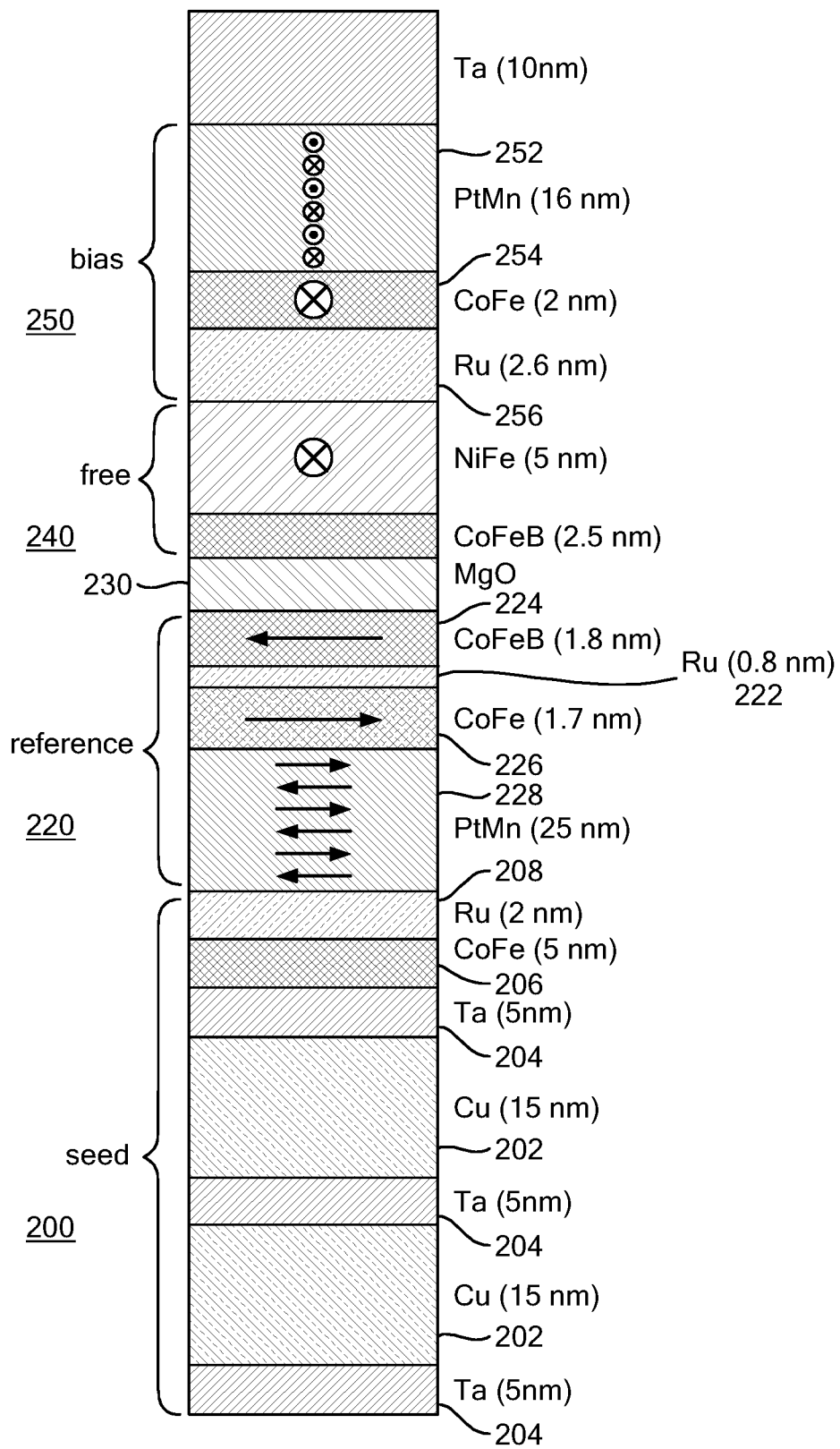
FIG. 2 shows an example layer stackup for an MR sensor in accordance with example embodiments of the disclosure.

FIG. 2 shows an example stackup for a magnetoresistive (MR) sensor having hysteresis suppression in accordance with example embodiments of the disclosure. A seed layer 200 may be provided on a substrate (not shown). In embodiments, the seed layer 200 includes one or more CoFe layers to suppress hysteresis as a result of desired texturing effects, as described more fully below. The seed layer 200 does not interact with the stack magnetically, but rather, provides an electrical contact to the MR elements.

In the illustrated embodiment, a reference layer 220 is disposed on the seed layer 200. A dielectric layer 230, such as an oxide layer, e.g., MgO, is located between the reference layer 220 and a free layer 240. In example embodiments, a bias layer 250 is disposed on the free layer 240. A contact 260, which may comprise Ta, for example, can be disposed on the bias layer to facilitate electrical connection to the MR stackup and protect the multilayer from environmental atmosphere.

The magnetic alignment of the reference layer 220 is fixed and the magnetic alignment of the free layer 240 moves in response to an external magnetic field. Movement can be referenced to parallel and anti-parallel positions. The resistance of the TMR spin valve changes as a function of the magnetic alignment of the reference and free layers. The optional bias layer 250 is magnetically coupled to the free layer 240. If no external magnetic field is present, the bias layer 250 may cause the magnetic alignment of the free layer 240 to default to a predetermined alignment. The magnetic coupling between the bias layer 250 and the free layer 240 is relatively weak so that an external field can override the bias and realign the magnetic alignment of the free layer. The bias layer 250 can provide a so-called double pinned configuration since the bias layer and the reference layer 220 pin the free layer. The bias layer 250 can help to linearize the response of the free layer 240, and therefore the resistance, to an external field.

In the illustrated embodiment, the bias layer 250 comprises PtMn in a first bias layer 252 about 16 nm thick, CoFe in a second bias layer 254 about 2 nm thick, and Ru in a third bias layer 256 about 2.6 nm thick. The bias layer 250 has a series of magnetic fields pointing in directions indicated by an X point into the page and a circle with a dot coming out of the page. In the illustrated embodiment, the second bias layer 254 has a field pointing into the page and the first bias layer 252 has a series of fields alternating in direction into and out of the page, as shown, which is a necessary condition for an antiferromagnet, such as PtMn), as the composing atoms are magnetic but there is no net moment because each layer is directly opposite to the neighboring ones.

In example embodiments, the free layer 240 comprises CoFeB in a layer about 2.5 nm think and NiFe in a layer about 5 nm thick with a field pointing into the page.

In the illustrated embodiment, the reference layer 220 includes an Ru layer 222 about 0.8 nm thick between a CoFeB layer 224 about 1.8 nm thick an a CoFe layer 226 about 1.7 nm thick. As can be seen, the CoFeB layer 224 and the CoFe layer 226 have magnetic fields pointing in opposite directions as indicated by the arrows pointing to the left and right sides of the page respectively. The reference layer 220 also includes a PtMn layer 228 about 25 nm thick with a series of fields pointing in alternating directions to the left and right sides of the page. As can be seen, the reference layer 220 and the bias layer 250 field point in orthogonal directions.

In example embodiments, the seed layer 200 comprises alternating layers of Cu 202 and Ta 204, which may provide electrical contacts to a substrate, a CoFe layer 206 about 5 nm in thickness adjacent to a Ta layer 204, and an Ru layer 208 about 2 nm in thickness adjacent the CoFe layer 206 and interfacing with the reference layer 220. It is understood that any practical number of alternating layers of Cu 202 and Ta 204 can be used including a single Cu layer in the seed layer.

In some embodiments, additional CoFe layers 206 in the seed layer can be used to meet the needs of particular application.

In embodiments, the CoFe layer 206 in the seed layer cancels magnetic coercivity and removes hysteresis at low fields in TMR stacks linearized with intra-stack bias. CoFe layers 206 in the seed layer results in a change in texturing of the whole multilayer stack, and in particular, of the free layer which is responsible for the low-field response of the TMR and governs the magnetic coercivity of the TMR stack.

Example embodiments of the seed layer generate additional crystalline anisotropy which provide hysteresis suppression. When the field applied is higher than the seed-induced anisotropy, the seed contribution is overcome, and the hysteresis cycle shows a typical opening. Example embodiments of the disclosure are particularly useful when the field used in the application is always lower than the seed-induced anisotropy, so that hysteresis is always negligible.

Other example embodiments can include alternative seed layer configurations and materials to suppress hysteresis. Example configurations are shown below in Table 1.

TABLE 1

| Ru | Ru | Ru |
|---|---|---|
| CoFe | CoFe | CoFe |
| Ru | Ta | Ru |
| CoFe | CoFe | NiFe |
| Ta | Ta | Ta |
| CuN | CuN | CuN |
| Ta | Ta | Ta |
| CuN | CuN | CuN |
| Ta | Ta | Ta |

It is understood that example dimensions are provided for the various layers in the stackup to facilitate an understanding of the disclosure and are not intended to limit the scope of the claimed invention in any way. It is understood that dimensions of the layers can be modified to meet the needs of a particular application. In addition, it is further understood that example materials are provided for which substitutions may be made to meet the needs of a particular application.

It is understood that TMR sensors can be used in a wide range of applications in which it is desirable to sense a magnetic field.

Figure 3:
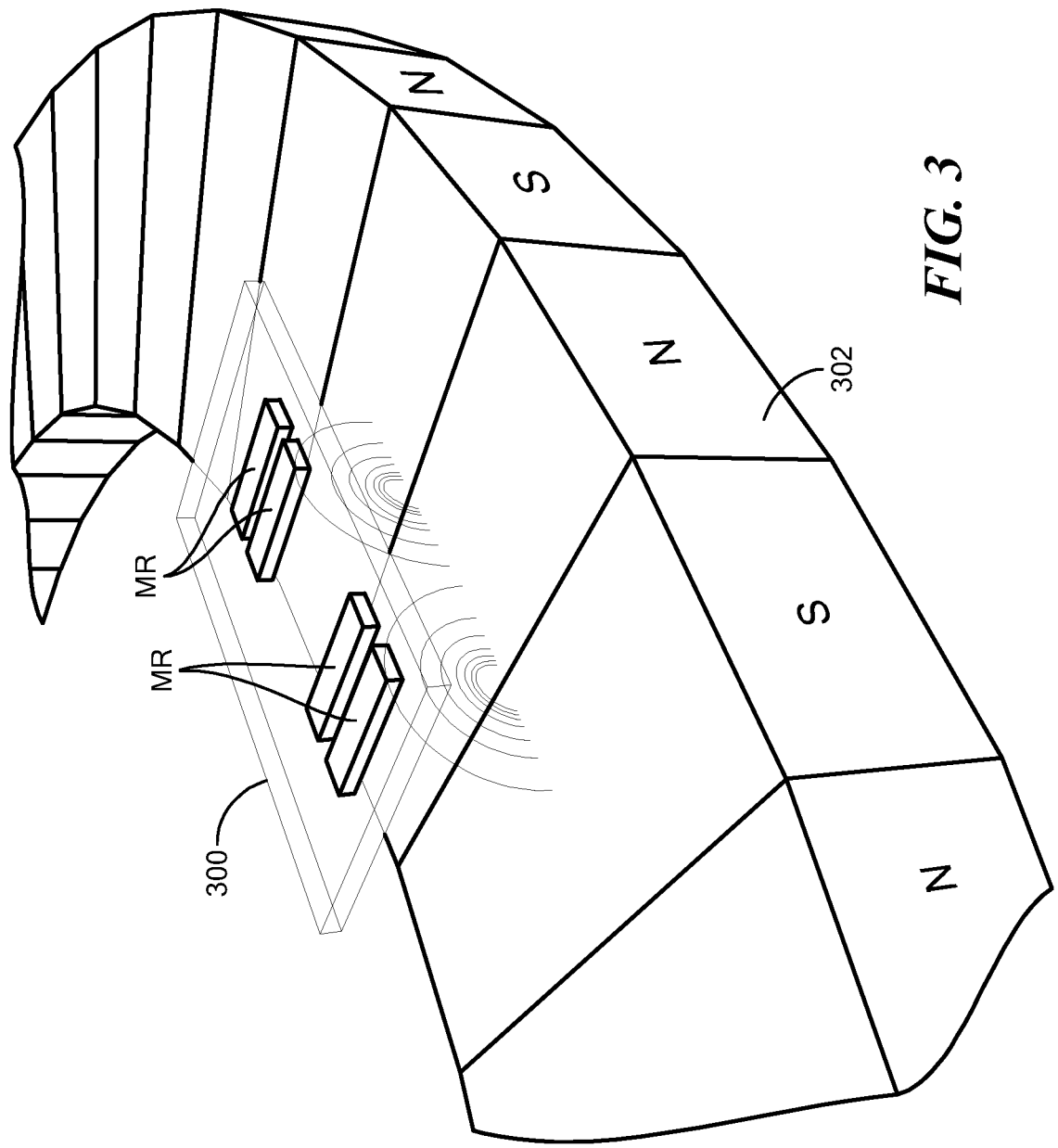
FIG. 3 shows an example MR magnetic field sensor having hysteresis suppression in accordance with example embodiments of the disclosure.

FIG. 3 shows one type of magnetic field sensor 300 that include one or more magnetoresistance elements MR with a seed layer that reduces hysteresis effects with the use of a CoFe layer. Here, four magnetoresistance elements are shown which can be of a type described above arranged over a common substrate. The four magnetoresistance elements can be arranged in a bridge. Other electronic components (not shown), for example, amplifiers and processors, can also be integrated upon the common substrate.

The magnetic field sensor 300 can be disposed proximate a moving magnetic object, for example, a ring magnet 302 having alternating north and south magnetic poles. The ring magnet 302 is subject to rotation. The magnetic field sensor 300 can be configured to generate an output signal indicative of at least a speed of rotation of the ring magnet. In some arrangements, the ring magnet 302 is coupled to a target object, for example, a cam shaft in an engine, and the sensed speed of rotation of the ring magnet 302 is indicative of a speed of rotation of the target object.

While the magnetic field sensor 300 is used as a rotation detector, it should be understood that other similar magnetic field sensors, for example, current sensors, can have one or more of the magnetoresistance elements Examples of MR sensors having double pinned arrangements can be found, for example, in U.S. Pat. Nos. 9,529,060, and 9,922,673, and 9,804,234, all of which are incorporated by reference herein in their entirety.

As used herein, the term "anisotropy" or "anisotropic" refer to a particular axis or direction to which the magnetization of a ferromagnetic or ferrimagnetic layer tends to orientate when it does not experience an additional external field. An axial anisotropy can be created by a crystalline effect or by a shape anisotropy, both of which allow two equivalent directions of magnetic fields. A directional anisotropy can also be created in an adjacent layer, for example, by an antiferromagnetic layer, which allows only a single magnetic field direction along a specific axis in the adjacent layer.

In view of the above, it will be understood that introduction of an anisotropy in a magnetic layer results in forcing the magnetization of the magnetic layer to be aligned along that anisotropy in the absence of an external field. In the case of a GMR or TMR element, a directional anisotropy provides an ability to obtain a coherent rotation of the magnetic field in a magnetic layer in response, for example, to an external magnetic field.

In general, magnetic materials can have a variety of magnetic characteristics and can be classified by a variety of terms, including, but not limited to, ferromagnetic, antiferromagnetic, and nonmagnetic. Description of the variety of types of magnetic materials is not made herein in detail. However, let it suffice here to say, that a ferromagnetic material is one in which magnetic moments of atoms within the ferromagnetic material tend to, on average, align to be both parallel and in the same direction, resulting in a nonzero net magnetic magnetization of the ferromagnetic material.

An antiferromagnetic material is one in which magnetic moments within the antiferromagnetic material tend to, on average, align to be parallel, but in opposite directions in sub-layers within the antiferromagnetic material, resulting in a zero net magnetization.

As used herein, the term "magnetic field sensing element" is used to describe a variety of electronic elements that can sense a magnetic field. The magnetic field sensing element can be, but is not limited to, a Hall effect element, a magnetoresistance element, or a magnetotransistor. As is known, there are different types of Hall effect elements, for example, a planar Hall element, a vertical Hall element, and a Circular Vertical Hall (CVH) element. As is also known, there are different types of magnetoresistance elements, for example, a semiconductor magnetoresistance element such as Indium Antimonide (InSb), a giant magnetoresistance (GMR) element, for example, a spin valve, an anisotropic magnetoresistance element (AMR), a tunneling magnetoresistance (TMR) element, and a magnetic tunnel junction (MTJ). The magnetic field sensing element may be a single element or, alternatively, may include two or more magnetic field sensing elements arranged in various configurations, e.g., a half bridge or full (Wheatstone) bridge. Depending on the device type and other application requirements, the magnetic field sensing element may be a device made of a type IV semiconductor material such as Silicon (Si) or Germanium (Ge), or a type III-V semiconductor material like Gallium-Arsenide (GaAs) or an Indium compound, e.g., Indium-Antimonide (InSb).

As is known, some of the above-described magnetic field sensing elements tend to have an axis of maximum sensitivity parallel to a substrate that supports the magnetic field sensing element, and others of the above-described magnetic field sensing elements tend to have an axis of maximum sensitivity perpendicular to a substrate that supports the magnetic field sensing element. In particular, planar Hall elements tend to have axes of sensitivity perpendicular to a substrate, while metal based or metallic magnetoresistance elements (e.g., GMR, TMR, AMR) and vertical Hall elements tend to have axes of sensitivity parallel to a substrate.

As used herein, the term "magnetic field sensor" is used to describe a circuit that uses a magnetic field sensing element, generally in combination with other circuits. Magnetic field sensors are used in a variety of applications, including, but not limited to, an angle sensor that senses an angle of a direction of a magnetic field, a current sensor that senses a magnetic field generated by a current carried by a current-carrying conductor, a magnetic switch that senses the proximity of a ferromagnetic object, a rotation detector that senses passing ferromagnetic articles, for example, magnetic domains of a ring magnet or a ferromagnetic target (e.g., gear teeth) where the magnetic field sensor is used in combination with a back-biased or other magnet, and a magnetic field sensor that senses a magnetic field density of a magnetic field.

Having described exemplary embodiments of the disclosure, it will now become apparent to one of ordinary skill in the art that other embodiments incorporating their concepts may also be used. The embodiments contained herein should not be limited to disclosed embodiments but rather should be limited only by the spirit and scope of the appended claims. All publications and references cited herein are expressly incorporated herein by reference in their entirety.

Elements of different embodiments described herein may be combined to form other embodiments not specifically set forth above. Various elements, which are described in the context of a single embodiment, may also be provided separately or in any suitable subcombination. Other embodiments not specifically described herein are also within the scope of the following claims.

What is claimed is:

1. A magnetoresistive sensor, comprising
   a free layer;
   an insulative barrier layer;
   a reference layer, wherein the free layer and the reference layer are on opposite sides of the barrier layer; and
   a seed layer comprising non-adjacent first and second layers of CoFe configured to interface with the reference layer for canceling hysteresis in the magnetoresistive sensor.

2. The sensor according to claim 1, wherein the seed layer comprises at least one layer of Cu and at least one layer of Ta.

3. The sensor according to claim 1, wherein the seed layer comprises alternating layers of Cu and Ta.

4. The sensor according to claim 1, wherein the first layer of CoFe is about 5 nm thick.

5. The sensor according to claim 1, wherein the first layer of CoFe is between about 4 nm and 6 nm thick.

6. The sensor according to claim 1, further including a bias layer adjacent the free layer to provide a double pinning configuration.

7. The sensor according to claim 1, wherein the seed layer further comprises a layer of Ru abutting the first layer of CoFe.

8. The sensor according to claim 7, wherein the Ru layer interfaces with the reference layer.

9. The sensor according to claim 7, wherein the seed layer further comprises a layer of NiFe.

10. A method, comprising:
    forming a free layer and a reference layer on opposite sides of an insulative barrier layer; and
    interfacing the reference layer with a seed layer comprising non-adjacent first and second layers of CoFe for canceling hysteresis in a magnetoresistive sensor.

11. The method according to claim 10, wherein the seed layer comprises at least one layer of Cu and at least one layer of Ta.

12. The method according to claim 10, wherein the seed layer comprises alternating layers of Cu and Ta.

13. The method according to claim 10, wherein the first layer of CoFe is about 5 nm thick.

14. The method according to claim 10, wherein the first layer of CoFe is between about 4 nm and 6 nm thick.

15. The method according to claim 10, further including providing a bias layer adjacent the free layer to provide a double pinning configuration.

16. The method according to claim 10, wherein the seed layer further comprises a layer of Ru abutting the first layer of CoFe.

17. The method according to claim 16, wherein the Ru layer interfaces with the reference layer.

18. The method according to claim 16, wherein the seed layer further comprises a layer of NiFe.

19. A magnetoresistive sensor, comprising
    a free layer;
    an insulative barrier layer;
    a reference layer, wherein the free layer and the reference layer are on opposite sides of the barrier layer; and
    a seed layer means for canceling hysteresis in the magnetoresistive sensor, wherein the seed layer means interfaces with the reference layer,
    wherein the seed layer means comprises non-adjacent first and second layers of CoFe.

20. The sensor according to claim 19, wherein the seed layer means further comprises a layer of Ru abutting the first layer of CoFe.

21. The sensor according to claim 19, wherein the first layer of CoFe is between about 4 nm and about 6 nm in thickness.

22. The sensor according to claim 19, wherein the seed layer means comprises at least one layer of Cu and at least one layer of Ta.

23. The sensor according to claim 22, wherein the first layer of CoFe is about 5 nm thick.

* * * * *